US010204961B2

(12) United States Patent
Guo

(10) Patent No.: US 10,204,961 B2
(45) Date of Patent: Feb. 12, 2019

(54) PHOTODETECTOR SUBSTRATE, PHOTODETECTOR HAVING THE SAME, AND METHOD OF MANUFACTURING THEREOF

(71) Applicant: BOE TECHNOLOGY GROUP CO., LTD., Beijing (CN)

(72) Inventor: Wei Guo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 317 days.

(21) Appl. No.: 15/037,989

(22) PCT Filed: Dec. 10, 2015

(86) PCT No.: PCT/CN2015/096903
§ 371 (c)(1),
(2) Date: May 19, 2016

(87) PCT Pub. No.: WO2016/201925
PCT Pub. Date: Dec. 22, 2016

(65) Prior Publication Data
US 2017/0194377 A1 Jul. 6, 2017

(30) Foreign Application Priority Data

Jun. 18, 2015 (CN) .......................... 2015 1 0341771

(51) Int. Cl.
H01L 27/146 (2006.01)
H01L 31/0376 (2006.01)
(52) U.S. Cl.
CPC .... H01L 27/14692 (2013.01); H01L 27/1461 (2013.01); H01L 27/1463 (2013.01);
(Continued)

(58) Field of Classification Search
CPC ...................... H01L 27/14663; H01L 31/085
See application file for complete search history.

(56) References Cited

U.S. PATENT DOCUMENTS

2010/0176401 A1 7/2010 Lee et al.
2011/0169794 A1 7/2011 Hara et al.
(Continued)

FOREIGN PATENT DOCUMENTS

CN 102629610 A 8/2012
CN 102891150 A 1/2013
(Continued)

OTHER PUBLICATIONS

First Office Action in the Chinese Patent Application No. 201510341771. 1, dated Jul. 17, 2017; English translation attached.
(Continued)

Primary Examiner — Raj R Gupta
(74) Attorney, Agent, or Firm — Westerman, Hattori, Daniels & Adrian, LLP

(57) ABSTRACT

The present application discloses a photodetector substrate comprising an array of a plurality of first electrodes; an array of a plurality of second electrodes, and an insulating block. The plurality of first electrodes and the plurality of second electrode are alternately arranged along a first direction, the plurality of first electrodes are disposed spaced apart from the plurality of second electrodes on a same layer; and the insulating block spaces apart at least a pair of adjacent first electrode and second electrode.

18 Claims, 3 Drawing Sheets

(52) U.S. Cl.
CPC .. *H01L 27/14612* (2013.01); *H01L 27/14659* (2013.01); *H01L 27/14676* (2013.01); *H01L 31/03762* (2013.01)

(56) References Cited

U.S. PATENT DOCUMENTS

| | | | |
|---|---|---|---|
| 2014/0367581 A1 | 12/2014 | Fujimura | |
| 2014/0374608 A1* | 12/2014 | Sasaki | H01L 31/02322 250/366 |
| 2015/0287760 A1* | 10/2015 | Karim | H01L 27/14663 257/53 |

FOREIGN PATENT DOCUMENTS

| | | |
|---|---|---|
| CN | 104237923 A | 12/2014 |
| CN | 105097860 A | 11/2015 |

OTHER PUBLICATIONS

International Search Report & Written Opinion dated Mar. 18, 2016 regarding PCT/CN2015/097050.

* cited by examiner

PHOTODETECTOR SUBSTRATE, PHOTODETECTOR HAVING THE SAME, AND METHOD OF MANUFACTURING THEREOF

CROSS-REFERENCE TO RELATED APPLICATION

This application is a national stage application under 35 U.S.C. § 371 of International Application No. PCT/CN2015/096903 filed Dec. 10, 2015, which claims priority to Chinese Patent Application No. 201510341771.1, filed Jun. 18, 2015, the contents of which are incorporated by reference in the entirety.

FIELD

The present invention relates to optical electrical technology, and more particularly, to a photodetector substrate, a photodetector having the same, and a manufacturing method thereof.

BACKGROUND

X-ray imaging system has found wide applications in various areas, including medicine, material analysis, and security. X-ray detector is the key component of the x-ray imaging system.

FIG. 1 is a diagram illustrating the structure and principle of a conventional photodetector including a photodetector substrate 111 and a readout circuit 6. The photodetector substrate 111 in FIG. 1 includes a base substrate 11, an array of thin film transistors 5 on the base substrate 11, a photon absorbing layer 1 on the array of thin film transistors 5, and multiple first electrodes 2 and second electrodes 3 between the array of thin film transistors 5 and the photon absorbing layer 1. The gate electrode and the drain electrode of each thin film transistor 5 are connected to the readout circuit 6. The drain electrode 6 is connected to ground through a storage capacitor 4, the other terminal of which is connected to the first electrode 2. The second electrode 3 is at positive potential.

When a photon having the right wavelength is absorbed by the photon absorbing layer 1, an electron-hole pair is produced. The holes migrate to the first electrode 2 under the electric field between the first electrode 2 and the second electrode 3, and are stored in the storage capacitor 4. The readout circuit 6 turns on the thin film transistors 5 sequentially, and read out the charge stored in the storage capacitor 4. The charge stored in each storage capacitor 4 correlates with the amount of photons absorbed in the corresponding photo absorbing layer 1.

Electron-hole pairs can also be randomly produced by temperature variation in the photo absorbing, layer 1, which results in dark current noise. The dark current noise may affect detection accuracy of the photodetector.

SUMMARY

In one aspect, the present invention provides a photodetector substrate comprising an array of a plurality of first electrodes; an array of a plurality of second electrodes, and an insulating block. The plurality of first electrodes and the plurality of second electrode are alternately arranged along a first direction, the plurality of first electrodes are disposed spaced apart from the plurality of second electrodes on a same layer; and the insulating block spaces apart one of the plurality of first electrodes from an adjacent one of the second electrodes along the first direction. Optionally, the insulating block spaces apart each of the plurality of first electrodes from adjacent second electrodes along the first direction, and the insulating block spaces apart each of the plurality of second electrodes from adjacent first electrodes along the first direction. Optionally, the insulating block is in contact with the adjacent first electrodes and second electrodes. Optionally, the insulating block comprises a material selected from the group consisting of the following or combination thereof: nylon, polypropylene, polytetrafluoroethylene, polyether-ether-ketone, polysulfone, polyetherimide, polyvinylidene fluoride, polyethylene terephthalate, polyphenylether, polyphenyl thioether, chlorinated polyvinyl chloride, acrylonitrile, polyethylene glycol terephthalate, polycarbonate, polyethylene, polyvinyl chloride, ultra high molecular weight polyethylene, polyimide, polyurethane, Poly-p-phenylene terephthalamide, phenolic cotton, polybenzimidazole, and polyamidoimide. Optionally, the insulating block comprises polyamidoimide. Optionally, the array of the plurality of first electrodes and the array of the plurality of second electrodes comprise two interleaving comb electrodes arranged in one plane, the digits of the first electrodes and the digits of the second electrodes are alternately arranged along the first direction and spaced apart. Optionally, the photodetector substrate further comprises a base substrate; an array of thin film transistors on the base substrate, wherein each of the thin film transistors comprises a metal block connected to drain electrode of the thin film transistor; a first insulating layer on the array of thin film transistors; a second insulating layer on the first insulating layer, wherein the plurality of first electrodes and the plurality of second electrodes are disposed on the second insulating layer; a capacitor electrode layer between the first insulating layer and the second insulating layer, wherein the capacitor electrode layer comprises a plurality of electrode pads; and a photon absorbing layer on top of the array of a plurality of first electrodes and the array of a plurality of second electrodes; wherein the metal block and the electrode pads form storage capacitance for storing photon detection signals; the metal block is connected to the corresponding first electrode through a via, which passes through the first insulating layer and the second insulating layer. Optionally, the insulating block is a part of the second insulating layer. Optionally, the photon absorbing layer is an amorphous silicon layer. Optionally, the metal block forms storage capacitance with two electrode pads disposed on two sides of the via.

In another aspect, the present invention provides a photodetector comprising the photodetector substrate described herein.

In another aspect, the present invention provides a method of manufacturing photodetector substrate. The method comprises forming an array of a plurality of first electrodes and an array of a plurality of second electrodes, wherein the plurality of first electrodes and the plurality of second electrode are alternately arranged along a first direction, the plurality of first electrodes are disposed spaced apart from the plurality of second electrodes on a same layer; and forming an insulating block between at least a pair of adjacent first electrode and second electrode along, the first direction, wherein the pair of adjacent first electrode and second electrode are spaced apart by the insulating block. Optionally, the method further comprises forming a plurality of insulating blocks between each of the plurality of first electrodes and each of the plurality of second electrodes along the first direction, wherein each of the plurality of first electrodes is spaced apart from adjacent second electrodes along the first direction by the insulating block, and each of the plurality of second electrodes is spaced apart from adjacent first electrodes along the first direction by the insulating block. Optionally, the method further comprises providing a base substrate; forming an array of a plurality of thin film transistors on the base substrate, wherein each of the thin film transistors comprises a metal block connected to drain electrode of the thin film transistor; forming a first insulating layer on the array of the plurality of thin film transistors; forming a capacitor electrode layer on the first insulating layer, wherein the capacitor electrode layer comprises a plurality of electrode pads; forming a second insulating layer on the capacitor electrode layer; forming an array of a plurality of first electrodes and an array of a plurality of second electrodes on the second insulating layer; and forming a photon absorbing layer on the array of the plurality of first electrodes and the array of the plurality of second electrodes; wherein the metal block and the electrode pads form storage capacitance for storing photon detection signals; the metal block is connected to the corresponding first electrode through a via, which passes through the first insulating layer and the second insulating layer. Optionally, prior to the step of forming the array of the plurality of first electrodes and the array of the plurality of second electrodes, the step of forming the insulating block comprises performing shallow etching on regions on the second insulating layer corresponding to the plurality of first electrodes and the plurality of second electrodes; and forming a plurality of insulating blocks on the second insulating layer between regions corresponding to the plurality of first electrodes and the plurality of second electrodes. Optionally, the step of forming the insulating block comprises depositing an insulating material between each of the plurality of first electrodes and each of the plurality of second electrodes; and patterning an array of insulating blocks on the second insulating layer.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of preferred embodiments are presented herein for purpose of illustration and description only. It is not intended to be exhaustive or to be limited to the precise form disclosed.

Figure 2:
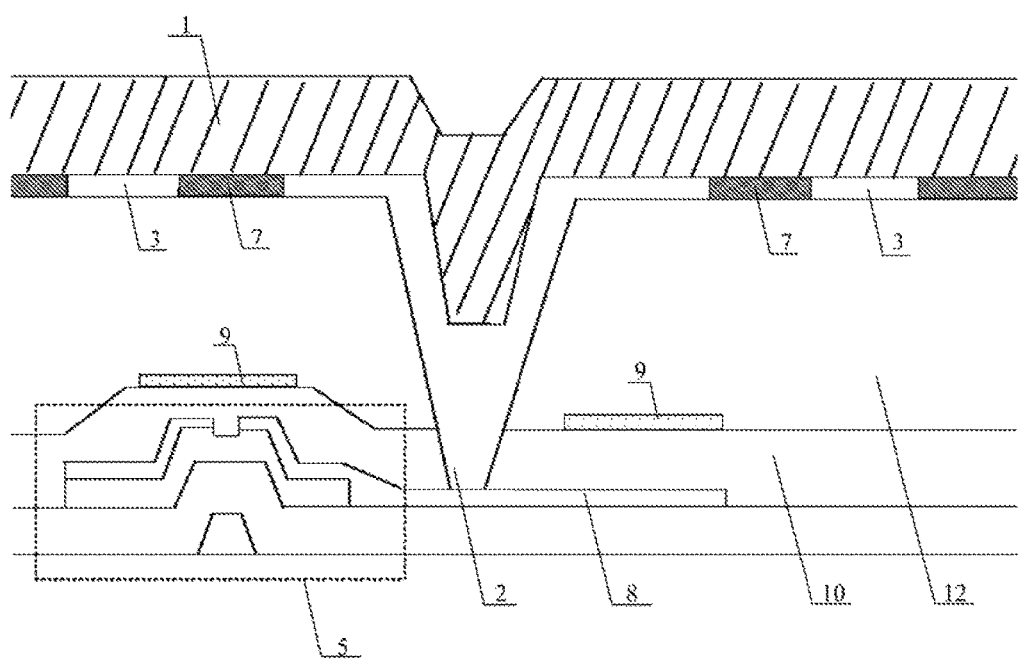
FIG. 2 is a diagram illustrating the structure of a photodetector substrate according to one embodiment.

FIG. 2 is a diagram illustrating the structure of a photodetector substrate according to one embodiment. Referring to FIG. 2, the photodetector substrate in the embodiment includes a plurality of first electrode 2 and a plurality of second electrode 3 disposed on a same layer. As used herein, the term "photodetector" refers to a device for detecting incident electromagnetic radiation. The term "electromagnetic radiation" may comprise any of a range of wavelengths of electromagnetic radiation. Examples of electromagnetic radiation include visible light, ultraviolet light, infrared light, X-ray, γ-ray, α-ray, β-ray, and neutron radiation. Depending on the wavelength of electromagnetic radiation of interest, appropriate types of photon absorbing materials can be selected. Optionally, a material that can produce large amounts of electrons/holes is selected as the photon absorbing material. For example, for detecting x-day, an amorphous silicon may be used as the photon absorbing material.

As used herein, the term "same layer" refers to the relationship between the layers simultaneously formed in the same step. In one example, two electrodes are on the same layer when the two electrodes are formed as a result of one or more steps of a same patterning process performed on a same layer of material. In another example, the first electrode 2 and the second electrode 3 can be formed in the same layer by simultaneously performing the step of forming the first electrode 2 and the step of forming the second electrode 3. The term "same layer" does not always mean that the thickness of the layer or the height of the layer in a cross-sectional view is the same.

Figure 1:
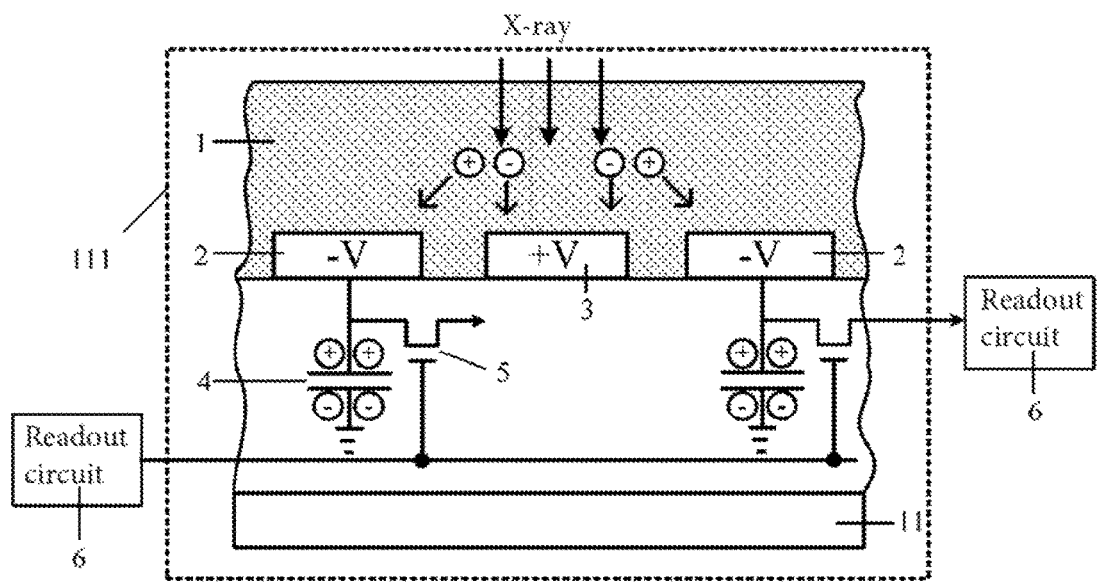
FIG. 1 is a diagram illustrating the structure and principle of a conventional photodetector.

As shown in FIG. 2, the plurality of first electrodes 2 and the plurality of second electrode 3 are alternately arranged along a first direction (e.g., the horizontal direction in plan view in FIG. 2). The first electrode 2 and the second electrode 3 are spaced apart on a same layer, The electric field produced between the first electrode 2 and the second electrode 3 is the strongest in the gap region between a first electrode 2 and a second electrode 3. Consequently, the gap region has the strongest potential to provide electrons or holes to the first electrode 2 and the second electrode 3, including the electron/hole produced by temperature variation. In a conventional photodetector, the gap between a first electrode 2 and a second electrode 3 is filled with the photon absorbing layer 1 material (see FIG. 1), which is prone to produce electron/hole pairs induced by temperature variation.

Based on the above, the photodetector substrate in the embodiment includes an insulating block 7 disposed within the gap region between the first electrode 2 and the second electrode 3, i.e., at least a pair of adjacent first electrode 2 and second electrode 3 are spaced apart by the insulating block 7. Thus, the photon absorbing material the gap region is replaced with an insulating material. Because insulating materials are not prone to produce electron/hole pairs caused by temperature variation, the dark current noise in the photodetector substrate is reduced. The photodetector substrate can include insulating blocks 7 in all gap regions or in some of the gap regions.

Having an insulating block 7 within the gap regions not only reduces electron/hole pairs caused by temperature variation, it also reduces electron/hole pairs produced by electromagnetic radiation within the photon absorbing layer 1. However, the amounts of electron/hole pairs produced by electromagnetic radiation decrease as the radiation travels through the photon absorbing layer 1, whereas the amounts of electron/hole pairs produced by temperature variation are more homogenously distributed. Optionally, the insulating block 7 can be disposed below the lower surface of the photon absorbing layer 7 (e.g., within the gap region). In doing so, the electron/hole pairs produced by electromagnetic radiation are reduced to a lesser degree than that of the electron/hole pairs produced by temperature variation. Signal-noise ratio of the photodetector is therefore enhanced.

To maximize the reduction of dark current noise, the insulating block 7 can be designed to occupy the entire gap region so that the insulating block 7 is in contact with the adjacent first electrode 2 and second electrode 3. Specifically, the width of the insulating block 7 can be the same as the distance between the adjacent first electrode 2 and second electrode 3. Optionally, the thickness of the insulating block 7 can be the same as that of the adjacent first electrode 2 and/or second electrode 3.

Various insulating materials can be used. Examples of such insulating materials include, but are not limited to, nylon, polypropylene, polytetrafluoroethylene, polyetherether-ketone, polysulfone, polyetherimide, polyvinylidene fluoride, polyethylene terephthalate, polyphenylether, thioether, chlorinated polyvinyl chloride, acrylonitrile, polyethylene glycol terephthalate, polycarbonate, polyethylene, polyvinyl chloride, ultra high molecular weight polyethylene, polyimide, polyurethane, Poly-p-phenylene terephthalamide, phenolic cotton, polybenzimidazole, polyamidoimide, and combinations thereof. Optionally, the insulating material comprises polyamidoimide, The plurality of first electrodes 2 can be individual first electrodes separated from each other, or can have a unibody structure. Similarly, the plurality of second electrodes 3 can be individual first electrodes separated from each other, or can have a unibody structure. Optionally, the plurality of first electrodes 2 can bhe a comb electrode, and the plurality of second electrodes 3 can also be a comb electrode. Optionally, the array of the plurality of first electrodes and the array of the plurality of second electrodes comprise two interleaving comb electrodes arranged in one plane, and the digits of the first electrodes and the digits of the second electrodes are alternately arranged along one direction and spaced apart.

Referring to FIG. 2, the photodetector substrate in the embodiment further includes a base substrate; an array of thin film transistors 5 on the base substrate; a first insulating layer 10 on the array of thin film transistors 5; a second insulating layer 12 on the first insulating layer 10; a capacitor electrode layer between the first insulating layer 10 and the second insulating layer 12; a plurality of first electrodes 2 and a plurality of second electrodes 3 disposed on the second insulating layer 12; and a photon absorbing layer 1 on the top of the array of a plurality of first electrodes 2 and the array of a plurality of second electrodes 3.

Optionally, the thin film transistor is a top gate type thin film transistor. Optionally, the thin film transistor is a bottom gate type thin film transistor.

Optionally, each of the thin film transistors has a metal block 8 connected to drain electrode of the thin film transistor. Optionally, the capacitor electrode layer comprises an electrode pad 9. The metal block 8 and the electrode pad 9 form storage capacitance for storing photon detection signals. The metal block 8 is connected to the corresponding first electrode 2 through a via, which passes through the first insulating layer 10 and the second insulating layer 12.

When a photon having the right wavelength is absorbed by the photon absorbing layer 1, the photon absorbing layer 1 is activated by the photon and produces an electron-hole pair. Under the electric field between the first electrode 2 and the second electrode 3, the holes migrate to the first electrode 2, and the electrons migrate to the second electrode 3. The electrons/holes are stored in the storage capacitor formed by the metal block 8 and the electrode pad 9. When the thin film transistor 5 is turned on, the amounts of electron/holes stored in the storage capacitor can be measured. The charge stored in the storage capacitor correlates with the amount of photons absorbed in the corresponding photo absorbing layer 1, which can then be calculated.

Optionally, each metal block 8 forms storage capacitance with only one electrode pad 9 in the capacitor electrode layer, i.e., each metal block 8 corresponds to one electrode pad 9 disposed in the capacitor electrode layer. Optionally, each metal block 8 forms storage capacitance with two electrode pads 8 in the capacitor electrode layer, i.e., each metal block 8 corresponds to two electrode pads 8 disposed in the capacitor electrode layer. The two electrode pads 8 can be disposed, e.g., on two sides of the via connecting the metal block 8 and the corresponding first electrode 2. Optionally, each metal block 8 forms storage capacitance with a plurality of electrode pads 8 in the capacitor electrode layer. For example, in each unit comprising a first electrode 2, a second electrode 3, and a thin film transistor 5, one or more (e.g., 2, 3, 4, 5, or more) electrode pads 8 can be disposed in the capacitor electrode layer. Similarly, each thin film transistor may include one or more (e.g., 2, 3, 4, 5, or more) metal block 8.

The layer comprising the insulating blocks can be a separate layer from the second insulating layer 12, or they can be the same layer. Optionally, the insulating block 7 forms a part of the second insulating layer 12.

The present invention also provides a method of manufacturing a photodetector substrate. The method in an embodiment includes a step of forming an array of a plurality of first electrodes 2 and an array of a plurality of second electrodes 3, and a step of forming an insulating block 7 between at least a pair of adjacent first electrode 2 and second electrode 3, for example, the pair of adjacent first electrode 2 and second electrode 3 are spaced apart by the insulating block 7. In some embodiments, the plurality of first electrodes and the plurality of second electrode are alternately arranged along a first direction, and the plurality of first electrodes are disposed spaced apart from the plurality of second electrodes on a same layer. In one example, a metal thin film layer is deposited, a photoresist is formed on the metal thin film layer and a mask having a predetermined pattern is placed on the photoresist layer, followed by UV exposure, development, baking and etching, and forming a layer having the array of first electrodes 2 and the array of second electrodes 3. The method steps as described herein are not necessarily performed sequentially, and in general can be performed in parallel with each other wherever possible.

Optionally, the method further includes a step of forming a plurality of insulating blocks 7 between each of the plurality of first electrodes 2 and each of the plurality of second electrodes 3 along first direction. Optionally, each of the plurality of first electrodes 2 is spaced apart from adjacent second electrodes 3 along, the first direction by the insulating block 7, and each of the plurality of second electrodes 3 is spaced apart from adjacent first electrodes 2 along the first direction by the insulating block 7. Optionally, some but not all first electrodes 2 are spaced apart from adjacent second electrodes 3 by insulating blocks 7. Optionally, some but not all second electrodes 3 are spaced apart from adjacent first electrodes 2 by insulating blocks 7.

In some embodiments, the method includes a step of providing a base substrate (e.g., a glass substrate); a step of forming an array of a plurality of thin film transistors 5 on the base substrate, wherein each of the thin film transistors 5 comprises a metal block 8 connected to drain electrode of the thin film transistor 5; a step of forming a first insulating layer 10 on the array of the plurality of thin film transistors 5; a step of forming a capacitor electrode layer on the first insulating layer 10, wherein the capacitor electrode layer comprises a plurality of electrode pads 9; a step of forming a second insulating layer 12 on the capacitor electrode layer; a step of forming an array of a plurality of first electrodes 2 and an array of a plurality of second electrodes 3 on the second insulating layer 12; and a step of forming a photon absorbing layer 1 on the array of the plurality of first electrodes 2 and the array of the plurality of second electrodes 3.

Optionally, each of the thin film transistors has a metal block 8 connected to drain electrode of the thin film transistor 5. Optionally, the capacitor electrode layer comprises an electrode pad 9. The metal block 8 and the electrode pad 9 form storage capacitance for storing photon detection signals. The metal block 8 is connected to the corresponding first electrode 2 through a via, which passes through the first insulating layer 10 and the second insulating layer 12. The capacitor electrode layer can be made of any suitable materials such as a metal or a transparent conductive material.

Optionally, the metal block 8 and the electrode pads 9 form storage capacitance for storing photon detection signals; the metal block 8 is connected to the corresponding first electrode 2 through a via, which passes through the first insulating layer 10 and the second insulating layer 12.

Optionally, each metal block 8 forms storage capacitance with only one electrode pad 9 in the capacitor electrode layer, i.e., each metal block 8 corresponds to one electrode pad 9 disposed in the capacitor electrode layer. Optionally, each metal block 8 forms storage capacitance with two electrode pads 8 in the capacitor electrode layer, i.e., each metal block 8 corresponds to two electrode pads 8 disposed in the capacitor electrode layer. The two electrode pads 8 can be disposed, e.g., on two sides of the via connecting the metal block 8 and the corresponding first electrode 2. Optionally, each metal block 8 forms storage capacitance with a plurality of electrode pads 8 in the capacitor electrode layer. For example, in each unit comprising a first electrode 2, a second electrode 3, and a thin film transistor 5, one or more (e.g., 2, 3, 4, 5, or more) electrode pads 8 can be disposed in the capacitor electrode layer. Similarly, each thin film transistor may include one or more (e.g., 2, 3, 4, 5, or more) metal block 8.

Figure 3:
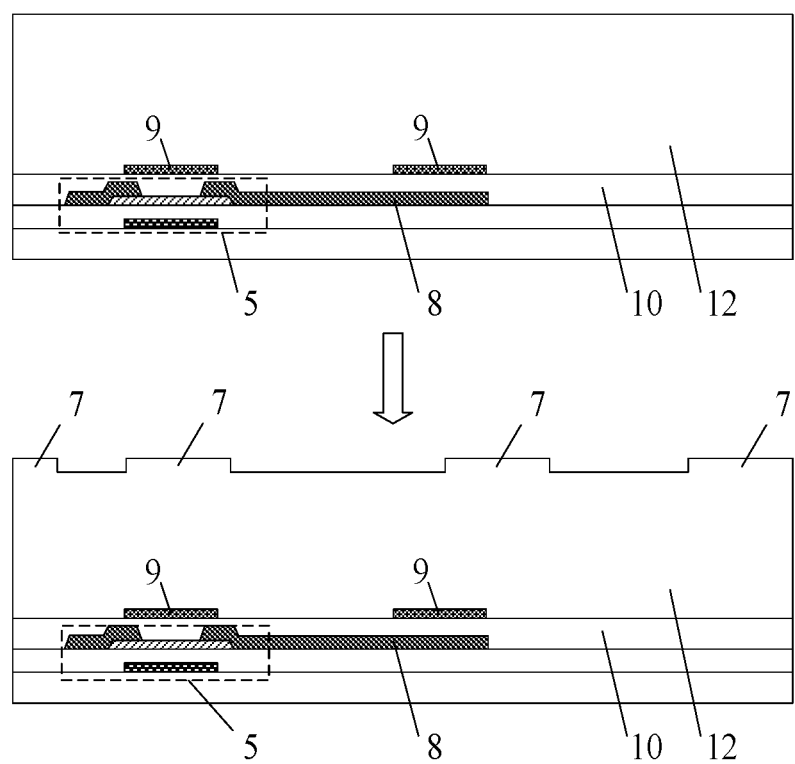
FIG. 3 is a diagram illustrating the method of performing etching on the second insulating layer and forming a plurality of insulating blocks on the second insulating layer.

Optionally, prior to the step of forming the array of the plurality of first electrodes 2 and the array of the plurality of second electrodes 3, the step of forming the insulating block 7 includes performing shallow etching on regions on the second insulating layer 12 corresponding to the plurality of first electrodes 2 and the plurality of second electrodes 3; and forming a plurality of insulating blocks 7 on the second insulating layer 12 between regions corresponding to the plurality of first, electrodes 2 and the plurality of second electrodes 3, as shown in FIG. 3.

Figure 4:
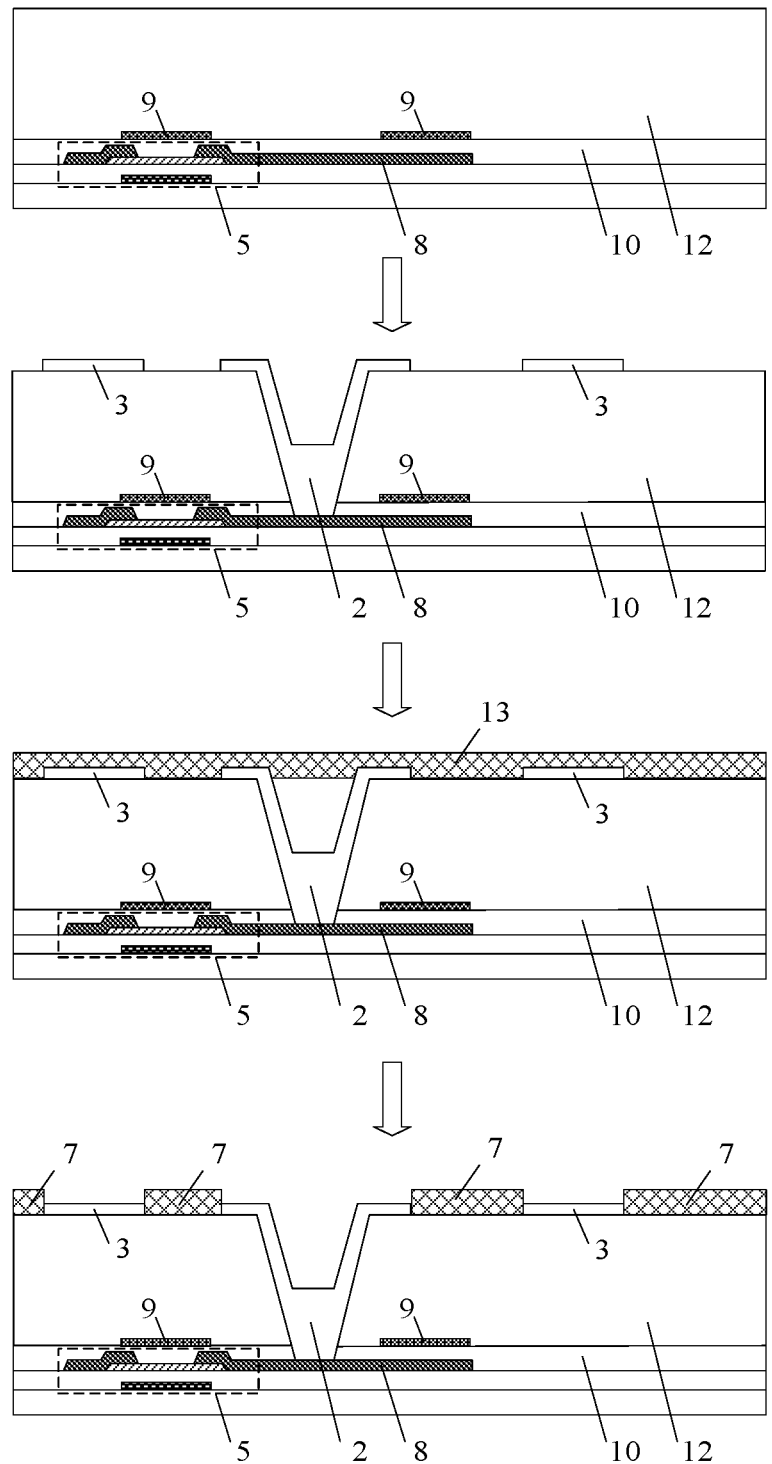
FIG. 4 is a diagram illustrating the method of depositing an insulating material and patterning an array of insulating blocks on the second insulating layer.

Optionally, after the step of forming the array of the plurality of first electrodes 2 and the array of the plurality of second electrodes 3, the method further includes depositing an insulating material 13 between each of the plurality of first electrodes 2 and each of the plurality of second electrodes 3; and patterning an array of insulating blocks 7 on the second insulating layer, as shown in FIG. 4.

The present invention also provides a photodetector having the photodetector substrate as described herein, or a photodetector manufactured by the method as described herein.

The foregoing description of the preferred embodiments of the invention has been presented for purposes of illustration and description. It is not intended to be exhaustive or to limit the invention to the precise firm or to exemplary embodiments disclosed. Accordingly, the foregoing description should be regarded as illustrative rather than restrictive. Obviously, may modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred, The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A photodetector substrate comprising:
   an array of a plurality of first electrodes;
   an array of a plurality of second electrodes;
   wherein the plurality of first electrodes and the plurality of second electrodes are alternately arranged along a first direction, the plurality of first electrodes are disposed spaced apart from the plurality of second electrodes on a same layer;
   an insulating block spacing apart one of the plurality of first electrodes from an adjacent one of the second electrodes along the first direction, and
   a photon absorbing layer on top of the array of the plurality of first electrodes and the array of the plurality of second electrodes;
   wherein the photon absorbing layer is in direct contact with at least a portion of at least one of the plurality of first electrodes, and the photon absorbing layer is in direct contact with at least a portion of at least one of the plurality of second electrodes.

2. The photodetector substrate of claim 1, wherein the insulating block spaces apart each of the plurality of first electrodes from adjacent second electrodes along the first direction, and the insulating block spaces apart each of the plurality of second electrodes from adjacent first electrodes along the first direction.

3. The photodetector substrate of claim 2, further comprising:
   a base substrate;
   an array of thin film transistors on the base substrate, wherein each of the thin film transistors comprises a metal block connected to drain electrode of the thin film transistor;

a first insulating layer on the array of thin film transistors;
a second insulating layer on the first insulating layer, wherein the plurality of first electrodes and the plurality of second electrodes are disposed on the second insulating layer; and
a capacitor electrode layer between the first insulating layer and the second insulating layer, wherein the capacitor electrode layer comprises a plurality of electrode pads;
wherein the metal block and the electrode pads form storage capacitance for storing photon detection signals;
the metal block is connected to the corresponding first electrode through a via, which passes through the first insulating layer and the second insulating layer.

4. The photodetector substrate of claim 3, wherein the insulating block is a part of the second insulating layer.

5. The photodetector substrate of claim 3, wherein the photon absorbing layer is an amorphous silicon layer.

6. The photodetector substrate of claim 3, wherein the metal block forms storage capacitance with two electrode pads disposed on two sides of the via.

7. The photodetector substrate of claim 3, wherein the photon absorbing layer is in direct contact with a side of the plurality of first electrodes opposite from the second insulating layer, and the photon absorbing layer is in direct contact with a side of the plurality of second electrodes opposite from the second insulating layer.

8. The photodetector substrate of claim 2, wherein the insulating block is in contact with the adjacent first electrodes and second electrodes.

9. The photodetector substrate of claim 1, wherein the insulating block is in contact with the adjacent first electrodes and second electrodes.

10. The photodetector substrate of claim 1, wherein the insulating block comprises a material selected from the group consisting of the following or combination thereof: nylon, polypropylene, polytetrafluoroethylene, polyetherether- ketone, polysulfone, polyetherimide, polyvinylidene fluoride, polyethylene terephthalate, polyphenylether, polyphenyl thioether, chlorinated polyvinyl chloride, acrylonitrile, polyethylene glycol terephthalate, polycarbonate, polyethylene, polyvinyl chloride, ultra high molecular weight polyethylene, polyimide, polyurethane, Poly-p-phenylene terephthalamide, phenolic cotton, polybenzimidazole, and polyamidoimide.

11. The photodetector substrate of claim 10, wherein the insulating block comprises polyamidoimide.

12. The photodetector substrate of claim 1, wherein the array of the plurality of first electrodes and the array of the plurality of second electrodes comprise two interleaving comb electrodes arranged in one plane, the digits of the first electrodes and the digits of the second electrodes are alternately arranged along the first direction and spaced apart.

13. A photodetector comprising the photodetector substrate of claim 1.

14. A method of manufacturing a photodetector substrate, comprising:
forming an array of a plurality of first electrodes and an array of a plurality of second electrodes, wherein the plurality of first electrodes and the plurality of second electrodes are alternately arranged along a first direction, the plurality of first electrodes are disposed spaced apart from the plurality of second electrodes on a same layer;
forming an insulating block between at least a pair of adjacent first electrode and second electrode along the first direction, wherein the insulating block spaces apart the pair of adjacent first electrode and second electrode; and
forming a photon absorbing layer on the array of the plurality of first electrodes and the array of the plurality of second electrodes;
wherein the photon absorbing layer is in direct contact with at least a portion of at least one of the plurality of first electrodes, and the photon absorbing layer is in direct contact with at least a portion of at least one of the plurality of second electrodes.

15. The method of claim 14, further comprising forming a plurality of insulating blocks between each of the plurality of first electrodes and each of the plurality of second electrodes along the first direction, wherein the insulating block spaces apart each of the plurality of first electrodes from adjacent second electrodes along the first direction, and the insulating block spaces apart each of the plurality of second electrodes from adjacent first electrodes along the first direction.

16. The method of claim 15, further comprising:
providing a base substrate;
forming an array of a plurality of thin film transistors on the base substrate, wherein each of the thin film transistors comprises a metal block connected to drain electrode of the thin film transistor;
forming a first insulating layer on the array of the plurality of thin film transistors;
forming a capacitor electrode layer on the first insulating layer, wherein the capacitor electrode layer comprises a plurality of electrode pads;
forming a second insulating layer on the capacitor electrode layer; and
forming an array of a plurality of first electrodes and an array of a plurality of second electrodes on the second insulating layer;
wherein the metal block and the electrode pads form storage capacitance for storing photon detection signals;
the metal block is connected to the corresponding first electrode through a via, which passes through the first insulating layer and the second insulating layer.

17. The method of claim 16, wherein, prior to the step of forming the array of the plurality of first electrodes and the array of the plurality of second electrodes, the step of forming the insulating block comprises:
performing shallow etching on regions on the second insulating layer corresponding to the plurality of first electrodes and the plurality of second electrodes, thereby forming a plurality of insulating blocks on the second insulating layer between regions corresponding to the plurality of first electrodes and the plurality of second electrodes.

18. The method of claim 16, wherein the step of forming the insulating block comprises:
depositing an insulating material between each of the plurality of first electrodes and each of the plurality of second electrodes; and patterning an array of insulating blocks on the second insulating layer.

* * * * *